United States Patent [19]

Crivello

[11] 4,216,288

[45] * Aug. 5, 1980

[54] HEAT CURABLE CATIONICALLY POLYMERIZABLE COMPOSITIONS AND METHOD OF CURING SAME WITH ONIUM SALTS AND REDUCING AGENTS

[75] Inventor: James V. Crivello, Clifton Park, N.Y.

[73] Assignee: General Electric Company, Schenectady, N.Y.

[*] Notice: The portion of the term of this patent subsequent to Nov. 6, 1996, has been disclaimed.

[21] Appl. No.: 940,564

[22] Filed: Sep. 8, 1978

Related U.S. Application Data

[63] Continuation-in-part of Ser. No. 841,351, Oct. 12, 1977, abandoned, and Ser. No. 781,785, Mar. 28, 1977, abandoned, each is a continuation-in-part of Ser. No. 689,247, May 24, 1976, abandoned, which is a continuation-in-part of Ser. No. 638,982, Dec. 9, 1975, Pat. No. 4,058,401, Ser. No. 638,983, Dec. 9, 1975, and Ser. No. 638,994, Dec. 9, 1975, Pat. No. 4,069,055, each is a continuation of Ser. No. 466,374, May 2, 1974, abandoned, Ser. No. 466,375, May 2, 1974, abandoned, and Ser. No. 466,378, May 2, 1974, abandoned.

[51] Int. Cl.² .......................... G03C 1/68; C08F 8/18; C08F 8/34

[52] U.S. Cl. .................... 430/280; 430/281; 204/159.18; 204/159.23; 528/90; 258/409

[58] Field of Search ................ 96/115 R, 115 P; 204/159.23, 159.24, 159.18; 528/90, 409

[56] References Cited

U.S. PATENT DOCUMENTS

| | | | |
|---|---|---|---|
| 3,808,006 | 4/1974 | Smith | 96/115 P |
| 4,058,400 | 11/1977 | Crivello | 96/115 P |
| 4,058,401 | 11/1977 | Crivello | 96/115 P |
| 4,069,054 | 1/1978 | Smith | 96/115 P |
| 4,069,055 | 1/1978 | Crivello | 96/115 R |
| 4,069,056 | 1/1978 | Crivello | 96/115 P |
| 4,102,687 | 7/1978 | Crivello | 204/159.24 |
| 4,108,747 | 8/1978 | Crivello | 96/115 P |
| 4,139,385 | 2/1979 | Crivello | 204/159.24 |

Primary Examiner—Jack P. Brammer
Attorney, Agent, or Firm—William A. Teoli; James C. Davis, Jr.

[57] ABSTRACT

Heat curable cationically polymerizable organic materials, such as epoxy resins, are described based on the use of an aromatic onium salt initiator which can be used in combination with a reducing agent. The heat curable compositions can be used in a variety of applications, such as coating compounds, photoresists, etc.

12 Claims, No Drawings

HEAT CURABLE CATIONICALLY POLYMERIZABLE COMPOSITIONS AND METHOD OF CURING SAME WITH ONIUM SALTS AND REDUCING AGENTS

This application is a continuation-in-part application of my copending applications Ser. No. 841,351, filed Oct. 12, 1977 now abandoned and Ser. No. 781,785, filed Mar. 28, 1977 now abandoned which are continuation-in-part applications of Ser. No. 689,247, filed May 24, 1976 now abandoned, which is a continuation-in-part application of copending application Ser. Nos. 638,982, now U.S. Pat. Nos. 4,058,401, 638,983 and 638,994, now U.S. Pat. No. 4,069,055, filed concurrently on Dec. 9, 1975, which are continuation applications respectively of abandoned applications Ser. Nos. 466,374, 466,375 and 466,378, filed concurrently on May 2, 1974, all of the above applications being assigned to the same assignee as the present invention.

The present invention relates to heat curable cationically polymerizable organic materials, such as an epoxy resin, cyclic ether, phenol-formaldehyde resin, epoxy siloxane, etc., which use an aromatic onium salt initiator, such as an aromatic halonium salt, or a Group Va or Group VIa onium salt in further combination with a reducing agent.

The term "reducing agent" as used hereinafter is a compound, or polymer having a molecular weight in the range of from about 80 to about 2000 and consisting of at least two or more chemically combined atoms selected from the class consisting of C, H, O, S, Si, halogen atoms, transition metals and metals selected from Groups III, IV, V, and VI metals, which reducing agents are capable of lowering, or reducing the charge of the hetero atom of an aromatic onium salt initiator selected from aromatic halonium salts, aromatic Group Va onium salts and aromatic Group VIa onium salts.

The heat curable compositions of the present invention comprise (A) a cationically polymerizable organic material, (B) from 0.5% to 25% by weight of (A) of a reducing agent and (C) from 0.1% to 15% by weight of the heat curable composition of an aromatic onium salt selected from the class consisting of aromatic halonium salts, Group Va onium salts and Group VIa onium salts.

As shown by my copending applications Ser. Nos. 638,982, now U.S. Pat. No. 4,058,401 and 638,994, now U.S. Pat. No. 4,069,055, assigned to the same assignee as the present invention, aromatic onium salts can be employed as photoinitiators to effect the cure of an epoxy resin. It was disclosed in the aforementioned copending applications that epoxy resins also can be heat cured without the use of radiant energy if desired. However, the heat cure of the epoxy resin employing the aforedescribed aromatic onium salts was considerably slower than by using a source of radiant energy, such as ultraviolet light. It has now been discovered that considerably faster heat cures of epoxy resins as well as a wide variety of other cationically polymerizable organic materials can be obtained using aromatic onium salts if the aromatic onium salt is used in combination with a reducing agent.

The aromatic onium salts as used in the practice of the present invention, are included within the formula, $$[Y]^+[J]^-, \quad (1)$$

where J is a non-nucleophilic counterion defined more particularly below, and Y is a cation selected from the class consisting of an aromatic halonium cation,

$$[(R)_a(R^1)_bD], \quad (2)$$

an aromatic Group Va cation,

$$[(R)_f(R^2)_g(R^3)_hE], \quad (3)$$

and an aromatic Group VIa cation,

$$[(R)_j(R^4)_k(R^5)_mG], \quad (4)$$

where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure selected from aliphatic radicals and aromatic radicals with E or G, D is a halogen radical, such as I, E is a Group Va element selected from N, P, As, Sb and Bi, G is a Group VIa element selected from S, Se and Te, "a" is a whole number equal to 0 or 2,
"b" is a whole number equal to 0 to 1 and when a is 0, b is 1 and when b is 0 a is 2,
"f" is a whole number equal to 0 to 4 inclusive,
"g" is a whole number equal to 0 to 2 inclusive,
"h" is a whole number equal to 0 to 2 inclusive, and the sum of "f"+"g"+"h" is a value equal to 4 or the combining valence of E,
"j" is a whole number equal to 0 to 3 inclusive,
"k" is a whole number equal to 0 to 2 inclusive, and
"m" is a whole number equal to 0 or 1, where the sum of "j" + "k" + "m" is a value equal to 3 or the combining valence of G.

Radicals included by R can be the same of different, aromatic carbocyclic or heterocyclic radicals having from 6 to 20 carbon atoms, which can be substituted with from 1 to 4 monovalent radicals selected from $C_{(1-8)}$ alkoxy, $C_{(1-8)}$ alkyl, nitro, chloro, etc., R is more particularly phenyl, chlorophenyl, nitrophenyl, methoxyphenyl, pyridyl, etc. Radicals included by $R^1$ are divalent radicals, such as

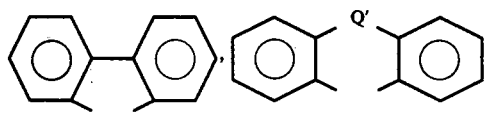

$R^2$ and $R^4$ radicals include $C_{(1-8)}$ alkyl, such as methyl, ethyl, etc., substituted alkyl, such as $-C_2H_4OCH_3$, $-CH_2COOC_2H_5$, $-CH_2COCH_3$, Q' is defined below, etc., $R^3$ and $R^5$ radicals include such structures as

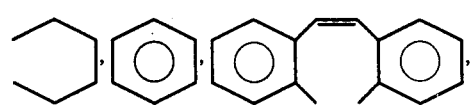

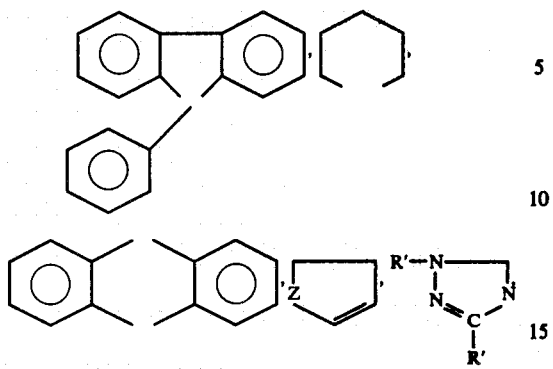

where Q' is selected from O, $(CH_2)_n$, N, R and S, n is an integer equal to 1–4 inclusive; Z is selected from —O—, —S— and

and R' is selected from hydrogen, $C_{(1-8)}$ alkyl, $C_{(6-13)}$ aryl, etc.

Non-nucleophilic counterions included by J of formula (1) are $MQ_d$ anions, where M is a metal or metalloid, Q is a halogen radical, and d is an integer such as 4–6 inclusive. In addition, J of formula (1), also can include non-nucleophilic counterions such as perchlorate, $CF_3SO_3^-$ and $C_6H_4SO_3^-$, etc. In instances where the cationically polymerizable material is a phenol-formaldehyde resin, or other formaldehyde condensation resin such as urea, etc., J. of formula (1) can be a halide counterion such as $Cl^-$, $Br^-$, $F^-$, etc., as well as nitrate, phosphate, etc.

Metal or metalloids included by M of the non-nucleophilic counterion, $MQ_d$ previously defined and included within J of formula (1) are transition metals such as Sb, Fe, Sn, Bi, Al, Ga, In, Ti, Zr, Sc, V, Cr, Mn, Cs, rare earth elements such as the lanthanides, for example, Cd, Pr, Nd, etc., actinides, such as Th, Pa, U, Np, etc., and metalloids such as B, P, As, etc. Complex anions included by $MQ_d$ are, for example, $BF_4^-$, $PF_6^-$, $AsF_6^-$, $SbF_6^-$, $FeCl_4^-$, $SnCl_6^-$, $SbCl_6^-$, $BiCl_5^=$, etc.

Halonium salts included by formula (1) and having formula (2) cations are for example,

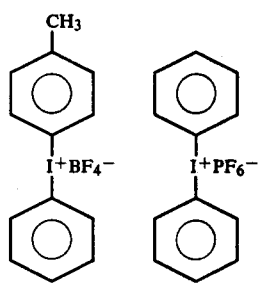

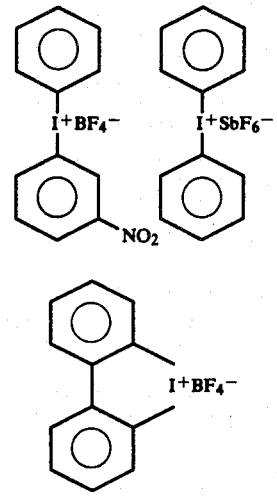

Group VA onium salts included by formula (1) and having formula (3) cations are for example,

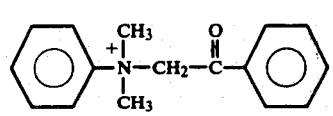

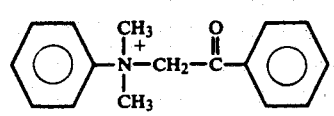

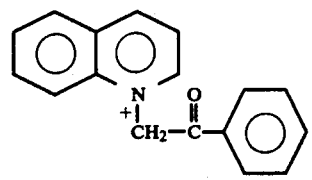

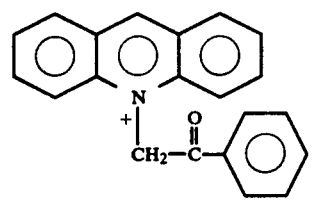

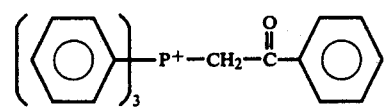

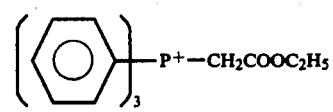

-continued

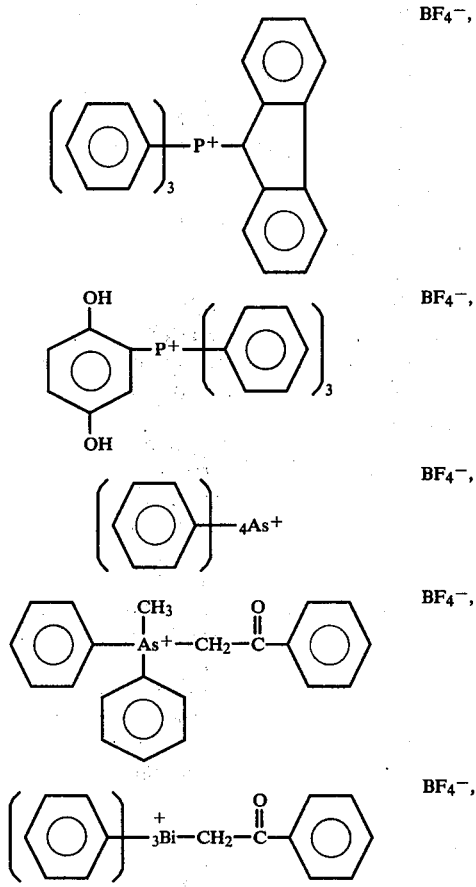

Group VIa onium salts included by formula (1) and having formula (4) cations are, for example,

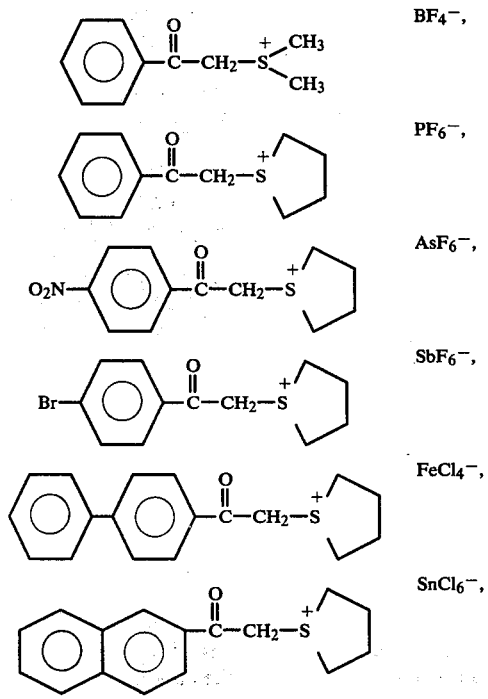

-continued

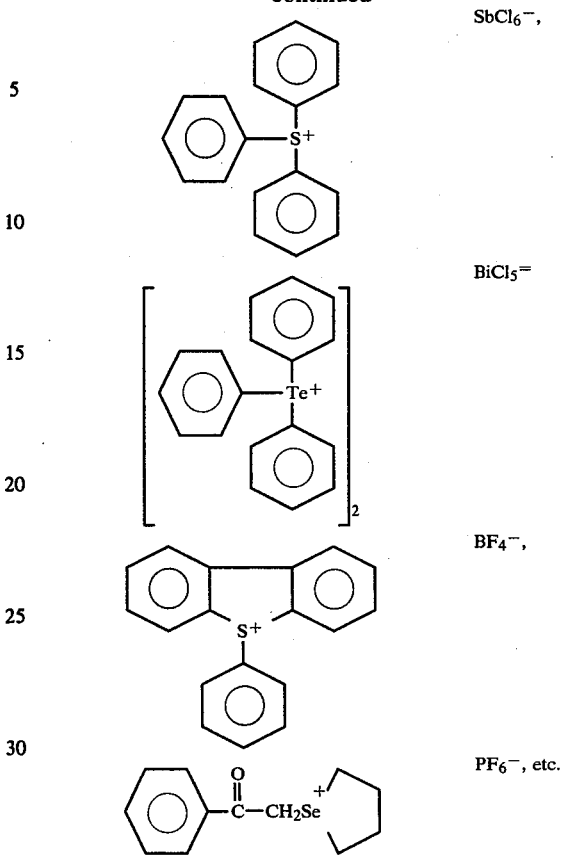

The term "epoxy resin" as utilized in the description of the curable compositions of the present invention, include any monomeric, dimeric or oligomeric or polymeric epoxy material containing one or a plurality of epoxy functional groups. For example, those resins which result from the reaction of bisphenol-A (4,4'-isoproylidenediphenol) and epichlorohydrin, or by the reaction of low molecular weight phenol-formaldehyde resins (Novolak resins) with epichlorohydrin, can be used alone or in combination with an epoxy containing compound as a reactive diluent. Such diluents as phenyl glycidyl ether, 4-vinylcyclohexene dioxide, limonene dioxide, 1,2-cyclohexene oxide, glycidyl acrylate, glycidyl methacrylate, styrene oxide, allyl glycidyl ether, etc., may be added as viscosity modifying agents. In addition, flexibilizers can be used such as hydroxy terminated polyesters and in particular hydroxyl terminated polycaprolactones such as Niax Polyols manufactured by the Union Carbide Corporation.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 80 632-5 (1959). As described in the literature, epoxy resins can also be modified in a number of standard ways such as reactions with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,804; 3,567,797; 3,677,995; etc. Further examples of epoxy resins which can be used are shown in the Encyclopedia of Polymer Science and Technology, Vol. 6, 1967, Interscience Publishers, New York pp. 209–271.

Additional cationically polymerizable organic materials which can be used in the heat curable compositions are thermosetting formaldehyde resins, cyclic ethers, lactones, lactams, cyclic acetals, vinyl organic prepolymers, etc.

Included by thermosetting organic condensation resins of formaldehyde which can be used in the practice of the present invention are, for example, urea type resins, such as

[CH$_2$=N—CONH$_2$]$_x$.H$_2$O,
[CH$_2$=NCONH$_2$]$_x$CH$_3$COOH,
[CH$_2$=NCONHCH$_2$NHCONHCH$_2$OH]$_x$;

phenol-formaldehyde type resins, such as

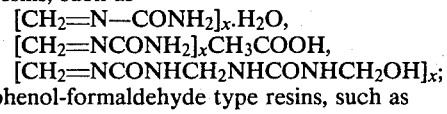

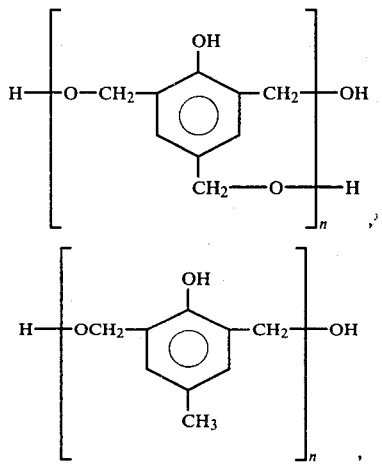

where x and n are integers having a value of 1 or greater than 1;

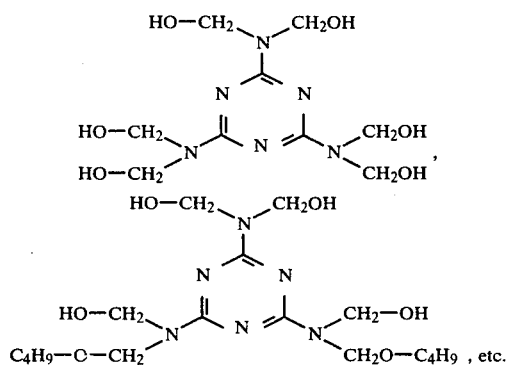

In addition, there can be used melamine thiourea resins, melamine, or urea aldehyde resins, cresol-formaldehyde resins and combinations with other carboxy, hydroxyl, amino and mercapto containing resins, such as polyesters, alkyds and polysulfides.

Some of the vinyl organic prepolymers which can be used to make the polymerizable compositions of the present invention are, for example, CH$_2$=CH—O—(CH$_2$—CH$_2$)$_n$—CH=CH$_2$, where n is a positive integer having a value up to about 1000 or higher; multi-functional vinyl ethers, such as 1,2,3-propane trivinyl ether, trimethylolpropane trivinylether, prepolymers having the formula,

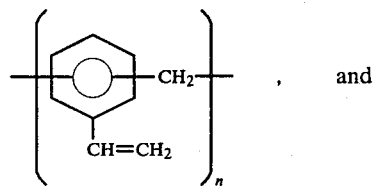

low molecular weight polybutadiene having a viscosity of from 200 to 10,000 centipoises at 25° C., etc. Products resulting from the cure of such compositions can be used as printing inks and other applications typical of thermosetting resins.

A further category of the organic materials which can be used to make the polymerizable compositions are cyclic ethers which are convertible to thermoplastics. Included by such cyclic ethers are, for example, oxetanes such as 3,3-bis-chloromethyloxetane alkoxyoxetanes as shown by Schroeter U.S. Pat. No. 3,673,216, assigned to the same assignee as the present invention; oxolanes such as tetrahydrofuran, oxepanes, oxygen containing spiro compounds, trioxane, dioxolane, etc.

In addition to cyclic ethers there are also included cyclic esters such as β-lactones, for example propiolactone, cyclic amines, such as 1,3,3-trimethyl-azetidine and organosilicon cyclics, for example, materials included by the formula,

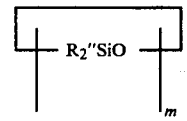

where R″ can be the same or different monovalent organic radical such as methyl or phenyl and m is an integer equal to 3 to 8 inclusive. An example of an organosilicon cyclic is hexamethyl trisiloxane, octamethyl tetrasiloxane, etc. The products made in accordance with the present invention are high molecular weight oils and gums.

Included by the reducing agents which can be used in combination with the aromatic onium salts of the present invention, are for example, thiophenols, reducing sugars, ascorbic acid, citric acid, iron salts, such as (C$_5$H$_5$)$_2$Fe, (C$_7$H$_{15}$CO$_2$)$_2$Fe, etc., cobalt salts, such as (C$_7$H$_{15}$CO$_2$)$_2$Co, Co$_2$(CO)$_6$[(C$_6$H$_5$)$_3$P]$_2$, etc., in addition to iron and cobalt salts, there also can be used tin salts, such as (C$_7$H$_{15}$CO$_2$)$_2$Sn,

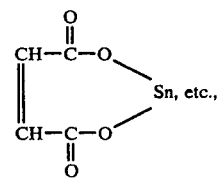

and copper (I) salts, such as CuI, CuBr and CuCl, etc.

The heat curable compositions of the present invention can be made by blending the cationically polymerizable organic material with an effective amount of the aromatic onium salt and in further combination with the reducing agent. In instances where the cationically polymerizable organic material is an epoxy resin, cyclic ether, cyclic ester and the like, as previously defined, the aromatic onium salt used is shown by formula (1), where J is an $MQ_d$ anion or $CF_3SO_3^-$ and $C_6H_4SO_3^-$. However, in instances where the cationically polymerizable material is a formaldehyde condensation resin as previously defined, J can also be halide, etc., as previously described. The resulting curable compositions can be in the form of a varnish having a viscosity of from 1 centipoise to 100,000 centipoises at 25° C., or a free flowing powder. The curable compositions can be applied to a variety of substrates by conventional means and cured to the tack-free state within from 0.5 to 20 minutes, depending upon the temperature employed, which can vary from 25° C. to 250° C.

Depending upon the compatibility of the onium salts with the epoxy resin as well as the reducing agent, the onium salts can be dissolved or dispersed along with the reducing agent into an organic solvent, such as nitromethane, acetonitrile, etc., prior to incorporation. In instances where the epoxy resin is a solid, incorporation of the onium salts can be achieved by dry milling or by melt mixing.

Formation of the onium salt in situ also can be achieved if desired. Experience has shown that the proportion of onium salt to epoxy resin can vary widely inasmuch as the salt is substantially inert, unless activated. Effective results can be achieved if a proportion of from 1% to 15% by weight of onium salt is employed, based on the weight of curable composition.

The curable compositions may contain inactive ingredients, such as inorganic fillers, dyes, pigments, extenders, viscosity control agents, process aids, UV-screens, etc., in amounts of up to 100 parts of filler per 100 parts of epoxy resin. The curable compositions can be applied to such substrates as metal, rubber, plastic, molded parts or films, paper, wood, glass cloth, concrete, ceramic, etc.

Some of the applications in which the curable compositions of the present invention can be used are, for example, protective, decorative and insulating coatings, potting compounds, printing inks, sealants, adhesives, molding compounds, wire insulation, textile coatings, laminates, impregnated tapes, varnishes, etc.

In order that those skilled in the art will be better able to practice the invention, the following examples are given by way of illustration and not by way of limitation. All parts are by weight.

EXMPLE 1

A mixture of 3% by weight of tetramethylenephenacyl sulfonium hexafluoroarsenate and 97% by weight of Epon 828, a diglycidyl ether of bisphenol-A of Shell Chemical Company, were heated in a vial to 150° C. After 20 minutes of heating, there was no evidence of gelation.

The above procedure was repeated, except that the mixture contained, in addition to the above-mentioned ingredients, 3% by weight of pentachlorothiophenol. It was found that a cured tack-free product was obtained by heating the mixture for 5 minutes at 150° C. Those skilled in the art know that the aforementioned curable mixture would be suitable for encapsulating electronic components.

EXAMPLE 2

A uniform mixture of 3 parts of tetramethylenephenacyl sulfonium hexafluoroantimonate and 7 parts of Epon 828 was found to convert to the solid tack-free state after being heated in a vial at 150° C. for 15 minutes. Another sample of the same mixture was blended with 3 parts of pentachlorothiophenol per 100 parts of mixture. It was found that cure of the resulting mixture to a tack-free state was achieved in 2.5 minutes at 150° C.

EXAMPLE 3

A blend of 97 parts of Epon 828 and 3 parts of tetramethylenephenyacyl sulfonium hexalfuoroantimonate was blended with 3 parts of thiophenol. It was found that a tack-free cure was obtained after 5 minutes at 150° C. Another blend was made following the same procedure, except that thiosalicylic acid was substituted for the thiophenol. A similar cure of the mixture was achieved after 3 minutes at 150° C.

EXAMPLE 4

A mixture of 3 parts of tetramethylenephenacyl sulfonium hexafluoroantimonate and 97 parts of Ciba Geigy cycloaliphatic bis epoxy CY-179 was heated at 150° C. It was found that after 3 minutes, a cure of the mixture was obtained at 150° C.

EXAMPLE 5

A blend of 97 parts of Epon 828 and 3 parts of diphenyliodonium hexafluoroarsenate was stirred in a vial and thereafter heated at 120° C. for 30 minutes. It was found that no significant change in the mixture occurred.

The above procedure was repeated, except that 3 parts of pentachlorothiophenol was blended with the same mixture. It was found that a tack-free product was obtained in a vial after 4 minutes at 120° C.

EXAMPLE 6

A blend of 97 parts of Ciba Geigy 179 and 3 parts of phenacyltriphenylphosphonium hexachloroantimonate was heated in a glass vial at 130° C. It was found that after 30 minutes, no significant change in the mixture occurred.

The above procedure was repeated, except that 3 parts of pentachlorothiophenol was added to the mixture. It was found that a tack-free product was obtained after 5 minutes at 130° C.

EXAMPLES 7-9

To separate 10 ml samples of Ciba Giegy bisepoxide CY-179 there was added 0.3 g 4,4'-dimethyldiphenyliodonium hexafluoroarsenate and 0.3 g of ferrocene, triron dodecacarbonyl and n-octylferrocene. These mixtures were heated in vials in an oil bath and the times requires for cure were recorded.

| Compound | Cure Time |
| --- | --- |
| None | 4 hours |
| 7. ferrocene | 6-7 min. |
| 8. triiron dodecacarbonyl | 3 min. |
| 9. n-octylferrocene | 7 min. |

In a separate experiment, when CY-179 was heated at 120° C. in the presence of ferrocene alone in the absence of the iodonium salt, cure failed to occur even after heating for 16 hours.

EXAMPLE 10-13

The previous experiment was repeated with the exception that the iron reducing agents were replaced with the following cobalt containing compounds:

| Compound | Cure Time |
| --- | --- |
| 10. None | 4 hours |
| 11. $Co_2(CO)_6[(C_6H_5)_3P]_2$ | 2 min. |
| 12. $Co_2(CO)_6[(C_6H_5)_2P—CH_3C_6H_4]_2$ | 4 min. |
| 13. $(C_7H_{15}CO_2)_2Co$ | 7. min. |

EXAMPLE 14

A mixture composed of 3% by weight 4,4-dimethyldiphenyliodonium hexafluoroarsenate, 3% by weight stannous octoate and 94% CY-179 was heated at 130° C. Cure occurred within 3 minutes. In the absence of stannous octoate, heating for 3 hours at 130° C. was required to produce curing.

EXAMPLE 15

A mixture of 3% by weight or 4,4'-dimethyldiphenyliodonium hexafluoroarsenate and 97% of bisphenol-A type resin (Ciba Geigy Araldite 6060) was heated at 170° C. At this temperature, one hour was required to cure this formulation. Incorporation of 3% stannous octoate into this mixture, resulted in a decrease in the cure time to 4.3 minutes.

EXAMPLE 16

A blend composed of 76% Ciba Giegy Araldite 6060, 2% diphenyliodonium hexafluoroarsenate, 2% stannous octoate and 20% chopped glass fiber was blended together at 100° C. This mixture was placed in a heated mold at 170° C. for four minutes. A white molded bar was obtained which had good mechanical properties and excellent solvent resistance.

EXAMPLE 17

To a mixture composed of 3% 4,4'-dimethyldiphenyliodonium hexafluoroarsenate and 91% CY-179 was added 6% ascorbic acid. At 130° C., the above composition cures in two and one-half minutes.

Addition of 6% ascorbic acid to CY-179 alone does not cause this bisepoxide to cure even when heated at 130° C. for over 1 hour.

EXAMPLE 18

A mixture of 0.5 g 4,4'-dimethyldiphenyliodonium hexafluoroarsenate and 40 g Shell bisphenol-A solid epoxy resin, Epon 1002, 1 g ascorbic acid and 15 g chopped glass fiber were mixed together in a Brabender Torque Rheometer at 90° C. A portion of this molding compound was pressed between heated metal plates at 165°-170° C. for 3 minutes. A flat molded film was obtained which had excellent solvent resistance in hydrocarbon solvents.

EXAMPLE 19

To a simple 3.24% solution of 4,4'-di-t-butyldiphenyliodonium hexafluorophosphate in CY-179 there was added various amounts of ferrocene. The samples were then heated in glass vials at 130° C. and the time required to cure the mixture was recorded.

| % Ferrocene | Cure Time |
| --- | --- |
| 18 | 210 seconds |
| 15 | 240 seconds |
| 12 | 275 seconds |
| 9 | 570 seconds |

EXAMPLE 20

A mixture of 3% di-t-butyldiphenyliodonium hexafluoroantimonate and 6% ferrocene in CY-179 cured in 2.75 minutes at 120° C.

By way of contrast, 3% by weight $BF_3$-monoethylamine in CY-179 requires 30 minutes of heating at 120° C. to bring it to the same state of cure. The above example shows the advantage of using the cationic system of the present invention over Lewis acid catalysts.

EXAMPLE 21

A solution containing 3% 4,4'-dimethyldiphenyliodonium hexafluoroarsenate and 6% ferrocene in CY-179 was stored in the for seven weeks. The solution did not gel or undergo a change in viscosity during this time.

In a similar study, a 3% solution of $BF_3$-monoethylamine in CY-179 gelled within three days. The above example shows the high degree of pot-life stability obtainable in the cationic system of this invention compared with the rather poor pot-life of Lewis acid-epoxy mixtures.

EXAMPLE 22

A solution composed of 3% by weight 4,4'-dimethyldiphenyliodonium hexafluoroarsenate in bisphenol-A-diglycidyl ether (Sheel Co. Epon 828) was divided into 10 samples. To each of the samples was added different amounts of ferrocene. The aliquots were then heated in glass vials and the time required for cure was measured on heating at 130° C.

| % Ferrocene | Cure Time (seconds) |
| --- | --- |
| 21 | 66 |
| 18 | 65 |
| 15 | 75 |
| 10 | 75 |
| 9 | 85 |
| 6 | 95 |
| 4 | 135 |
| 3 | 210 |
| 2 | 220 |
| 1 | 435 |
| 0 | >144,000 |

EXAMPLE 23

A mixture of Ciba Geigy bisphenol-A solid epoxy resin containing 1.5% by weight diphenyliodonium hexafluoroarsenate and 3% ascorbic acid was placed in the mixing bowl of a brabender mixer at 90° C. Both the torque and temperature were continuously monitored as an indication of cure. After 45 minutes, no change in the viscosity or temperature had occurred. At this point the temperature was raised rapidly to 170° C. Cure occurred within 6 minutes after the rise in temperature was begun as indicated by the rapid increase in both torque and temperature. The resin produced was a solid highly crosslinked material which could not be further melted.

When the same mixture of ingredients were placed in the mixing bowl of a brabender mixer at 170, cure occured in 45 seconds.

The above two experiments show a unique feature of the redox cationic systems of this invention to be melted and handled at temperatures as high as 90° C. for extended periods and then subsequently to cure rapidly when heated to elevated temperatures.

EXAMPLE 24

A mixture composed of 3% 4,4'-dimethyldiphenyliodonium hexafluoroarsenate, 3% cuprous bromide and 94% CY-179 was heated at 120° C. in an aluminum cup. The mixture cured to a hard nonfusible mass in 10-12 minutes.

EXAMPLE 25

There were added 2 parts of diphenyliodonium hexafluoroarsenate and 2 parts ferrocene to 46 parts diethylene glycol divinyl ether. The mixture was poured into an aluminum cup and heated to 100° C. A very rapid exothermic polymerization took place with the formation of crosslinked, hard resin.

EXAMPLE 26

There were added two parts diphenyldiodonium perchlorate and 3 parts ferrocene to 95 parts of a phenol-formaldehyde resin (Methylon 11 of the General Electric Company). The reaction mixture was heated to 120° C. in an aluminum cup. The resin gelled to a hard crosslinked mass after 5 minutes.

EXAMPLE 27

There were added 0.3 part of diphenyliodonium hexafluorophosphate and 0.3 part of cuprous bromide to 10 parts of $\epsilon$-caprolactone and the resulting mixture was thoroughly stirred. The mixture was then heated to 100° C. for 15 minutes and it was found to change from a viscous stirrable mixture to a hard tack-free solid. Based on method of preparation, the solid was polycaprolactone.

EXAMPLE 28

There were added 0.3 part of pentamethylene phenacylsulfoniumhexafluoroarsenate and 0.2 part of pentachlorothiophenol to 10 parts of $\epsilon$-caprolactone. After the mixture was thoroughly stirred, it was heated at 100° C. for 15 minutes. There was obtained a solid which on precipitation into methanol resulted in solid polycaprolactone.

EXAMPLE 29

A mixture of 20 parts of a phenolic based resol, Methylon 75201, a product of the General Electric Company, 0.3 part of diphenyliodoniumhexafluoroarsenate, and 0.2 part of cuprous bromide was poured into a shallow aluminum cup. The mixture was heated in a forced air oven at 100° C. for 15 minutes. There was obtained a cross-linked, hard tack-free product.

EXAMPLE 30

A mixture of 10 parts of a urea-formaldehyde resin, Beetle 65, a product of the American Cyanamide Company, 0.15 part of diphenyliodoniumhexafluoroarsenate and 0.3 part of t-butylferrocene were placed in a screw cap vial and heated in a forced air oven at 110° C. After one hour the mixture was converted from the pourable state to a hard cross-linked polymer.

EXAMPLE 31

There were added to 100 parts of a silicone gum consisting essentially of chemically combined dimethylsiloxy units and methylsiloxy glycidyl propionate units and terminated with dimethylsiloxy glycidyl propionate units, 3 parts of diphenyliodoniumhexafluoroarsenate and 3 parts of t-butylferrocene. The mixture was stirred and then heated for 5 minutes at 120° C. There was obtained an elastomeric hard rubber useful as an insulating compound and an encapsulant.

Although the above examples are directed to only a few of the very many variables which can be used in the compositions of the present invention, it should be understood that the heat curable compositions of the present invention are directed to a much broader variety of materials comprising the aromatic onium salts of formula (1) in combination with the cationically polymerizable organic material and the reducing agent as shown in the description proceding these examples.

What I claim as new and desire to secure by Letters Patent of the United States is:

1. Heat curable compositions comprising
   (A) a cationically polymerizable organic material,
   (B) from 0.1 to 15% by weight of an aromatic onium salt of the formula, $$[Y]^+[J]^-,$$

(C) from 0.5% to 25% by weight of a compound, or polymer having a molecular weight in the range of from about 80 to 2000 and consisting of at least two or more chemically combined atoms selected from the class consisting of C, H, O, S, Si, halogen atoms, transition metals and metals selected from Groups III, IV, V and VI metals, which compound or polymer is capable of lowering, or reducing the charge of the hetero atom of an aromatic onium salt initiator selected from aromatic halonium salts, aromatic Group Va onium salts and aromatic Group VIa onium salts, where J is a counterion selected from the class consisting of $MQ_d$ anions, where M is a metal or metalloid, Q is a halogen radical, and d is an integer from 4-6 inclusive, perchlorate, $CF_3SO_3^-$, $C_6H_4SO_3^-$, $Cl^-$, $Br^-$, $F^-$, nitrate and phosphate, Y is a cation selected from the class consisting of an aromatic halonium cation, $$[(R)_a (R^1)_b D],$$

an aroamatic Group Va cation, $$[(R)_f (R^2)_g (R^3)_h E],$$

and an aromatic Group VIa cation, $$[(R)_j (R^4)_k (R^5)_m G],$$

where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure selected from aliphatic radicals and aromatic radicals with E or G, D is a halogen radical, E is a Group Va element selected from N, P, As, Sb and Bi, G is a Group VIa element selected from S, Se and Te, "a" is a whole number equal to 0 or 2,
"b" is a whole number equal to 0 or 1,
and the sum of "a"+"b" is equal to 2 or the valence of D,
"f" is a whole number equal to 0 to 4 inclusive,
"g" is a whole number equal to 0 to 2 inclusive,
"h" is a whole number equal to 0 to 2 inclusive
and the sum of "f"+"g"+"h" is a value equal to 4 or the valence of E,
"j" is a whole number equal to 0 to 3 inclusive,
"k" is a whole number equal to 0 to 2 inclusive,
"m" is a whole number equal to 0 or 1,
where the sum of "j"+"k"+"m" is a value equal to 3 or the valence of G.

2. A method which comprises heating a curable composition to a temperature in the range of between 25° C. to 250° C. comprising (A) a cationically polymerizable organic material,
(B) from 0.1 to 15% by weight of an aromatic onium salt of the formula, $$[Y]^+[J],$$

(C) from 0.5% to 25% by weight of a compound, or polymer having a molecular weight in the range of from about 80 to 2000 and consisting of at least two or more chemically combined atoms selected from the class consisting of C, H, O, S, Si, halogen atoms, transition metals and metals selected from Groups III, IV, V and VI metals, which compound or polymer is capable of lowering, or reducing the charge of the hetero arom of an aromatic onium salt initiator selected from aromatic halonium salts, aromatic Group Va onium salts and aromatic Group VIa onium salts, where J is a counterion selected from teh class consisting of $MQ_d$ anions, where M is a metal or metalloid, Q is a halogen radical, and d is an integer from 4–6 inclusive, perchlorate, $CF_3SO_3^-$, $C_6H_4SO_3^-$, $Cl^-$, $Br^-$, $F^-$, nitrate and phosphate, Y is a cation selected from the class consisting of an aromatic halonium cation, $$[(R)_a(R^1)_b\,D],$$

an aromatic Group Va cation, $$[(R)_f(R^2)_g(R^3)_h\,E],$$

and an aromatic Group VIa cation, $$[(R)_j(R^4)_k(R^5)_m\,G],$$

where R is a monovalent aromatic organic radical, $R^1$ is a divalent aromatic organic radical, $R^2$ and $R^4$ are monovalent organic aliphatic radicals selected from alkyl, cyclo alkyl and substituted alkyl, $R^3$ and $R^5$ are polyvalent organic radicals forming a heterocyclic or fused ring structure selected from aliphatic radicals and aromatic radicals with E or G, D is a halogen radical, E is a Group Va element selected from N, P, As, Sb and Bi, G is a Group VIa element selected from S, Se and Te, "a" is a whole number equal to 0 or 2,
"b" is a whole number equal to 0 or 1,
and the sum of "a"+"b" is equal to 2 or the valence of D,
"f" is a whole number equal to 0 to 4 inclusive,
"g" is a whole number equal to 0 to 2 inclusive,
"h" is a whole number equal to 0 to 2 inclusive,
and the sum of "f"+"g"+"h" is a value equal to 4 or the valence of E,
"j" is a whole number equal to 0 to 3 inclusive,
"k" is a whole number equal to 0 to 2 inclusive,
"m" is a whole number equal to 0 or 1,
where the sum of "j"+"k"+"m" is a value equal to 3 or the valence of G.

3. A curable composition in accordance with claim 1, where J is $MQ_d$.

4. A curable composition in accordance with claim 3, where the aromatic onium salt is an aromatic iodonium salt.

5. A curable composition in accordance with claim 3, where the aromatic onium salt is an aromatic sulfonium salt.

6. A curable composition in accordance with claim 5, where the reducing agent is pentachlorothiophenol.

7. A heat curable composition in accordance with claim 3, where the aromatic halonium salt is diphenyliodonium hexafluoroarsenate.

8. A heat curable composition in accordance with claim 3, where the aromatic onium salt is triphenylphosphonium phenacyl hexafluoroantimonate.

9. A heat curable composition in accordance with claim 3, where the aromatic onium salt is tetrameythylenephen acyl sulfonium hexafluoroarsenate.

10. A heat curable composition in accordance with claim 3, where the reducing agent is pentachlorothiophenol.

11. A heat curable composition in accordance with claim 3, where the reducing agent is ferrocene.

12. A heat curable composition in accordance with claim 3, where the reducing agent is stannous actoate.

* * * * *

UNITED STATES PATENT AND TRADEMARK OFFICE
CERTIFICATE OF CORRECTION

PATENT NO. : 4,216,288
DATED : Aug. 5, 1980
INVENTOR(S) : James V. Crivello

It is certified that error appears in the above-identified patent and that said Letters Patent are hereby corrected as shown below:

In the Title, cancel

"HEAT CURABLE CATIONICALLY POLYMERIZABLE COMPOSITIONS AND METHOD OF CURING SAME WITH ONIUM SALTS AND REDUCING AGENTS"

and substitute

-HEAT CURABLE CATIONICALLY POLYMERIZABLE COMPOSITIONS WITH ONIUM SALTS AND REDUCING AGENTS AND METHOD OF CURING SAME-

Signed and Sealed this

Eighteenth Day of November 1980

[SEAL]

Attest:

Attesting Officer

SIDNEY A. DIAMOND

Commissioner of Patents and Trademarks